(12) United States Patent
Gregerson (10) Patent No.: US 10,388,554 B2
(45) Date of Patent: Aug. 20, 2019

(54) WAFER SHIPPER WITH PURGE CAPABILITY

(71) Applicant: Entegris, Inc., Billerica, MA (US)

(72) Inventor: Barry Gregerson, Deephaven, MN (US)

(73) Assignee: ENTEGRIS, INC., Billerica, MA (US)

( * ) Notice: Subject to any disclaimer, the term of this patent is extended or adjusted under 35 U.S.C. 154(b) by 232 days.

(21) Appl. No.: 15/481,031

(22) Filed: Apr. 6, 2017

(65) Prior Publication Data

US 2017/0294329 A1    Oct. 12, 2017

Related U.S. Application Data

(60) Provisional application No. 62/319,127, filed on Apr. 6, 2016.

(51) Int. Cl.
*H01L 21/673* (2006.01)
*B65D 85/30* (2006.01)

(52) U.S. Cl.
CPC ........ *H01L 21/67389* (2013.01); *B65D 85/30* (2013.01); *H01L 21/67373* (2013.01); *H01L 21/67376* (2013.01); *H01L 21/67379* (2013.01); *H01L 21/67386* (2013.01)

(58) Field of Classification Search
CPC ............. H01L 21/673; H01L 21/67369; H01L 21/67373; H01L 21/67376; H01L 21/67379; H01L 21/67383; H01L 21/67386; H01L 21/67389; B65D 85/30
USPC .................. 141/8, 11, 63, 66; 206/710, 711; 211/41.18
See application file for complete search history.

(56) References Cited

U.S. PATENT DOCUMENTS

| 5,788,082 | A | 8/1998 | Nyseth |
| 6,010,008 | A | 1/2000 | Nyseth et al. |
| 6,267,245 | B1 | 7/2001 | Bores et al. |
| 6,354,601 | B1 | 3/2002 | Krampotich et al. |
| 6,428,729 | B1 | 8/2002 | Bhatt et al. |
| 7,328,727 | B2 * | 2/2008 | Tieben .............. H01L 21/67379 141/8 |
| 8,091,592 | B2 * | 1/2012 | Sato .................. H01L 21/67393 206/710 |
| 8,727,125 | B2 | 5/2014 | Tieben et al. |
| 8,783,463 | B2 | 7/2014 | Watson et al. |
| 9,054,144 | B2 | 6/2015 | Burns et al. |

(Continued)

FOREIGN PATENT DOCUMENTS

| CN | 205845920 U | 12/2016 |
| TW | M532450 U | 11/2016 |

*Primary Examiner* — Bryon P Gehman
(74) *Attorney, Agent, or Firm* — Entegris, Inc.

(57) ABSTRACT

A purge configurable wafer shipper. The container includes an enclosure portion with an open side or bottom, a door to sealing close the open side or bottom. One of the door and the container portion includes an opening formed in the enclosure portion to provide a fluid passageway from an interior of the wafer shipper to an exterior region. The opening may include a module receiving structure that defines the fluid passageway. A sealing member is included for insertion into the module receiving structure. The sealing member has a body portion including a support flange positioned proximate a lower portion of the body portion, a circumferential groove in the exterior surface of the body portion, and an O-ring positioned at least partially within the circumferential groove.

19 Claims, 10 Drawing Sheets

(56) References Cited

U.S. PATENT DOCUMENTS

| | | |
|---|---|---|
| 2013/0299384 A1 | 11/2013 | Fuller |
| 2015/0041353 A1 | 2/2015 | Adams et al. |
| 2015/0083639 A1 | 3/2015 | Gregerson |
| 2017/0271188 A1* | 9/2017 | Fuller ............... H01L 21/67379 |

* cited by examiner

WAFER SHIPPER WITH PURGE CAPABILITY

This application claims the benefit of U.S. Provisional Application No. 62/319,127, which was filed on Apr. 6, 2016. The entire content of the application is herein incorporated by reference in its entirety.

FIELD OF THE INVENTION

The present disclosure relates to substrate containers including wafer enclosures, and more specifically, to front opening shipping containers for wafers.

BACKGROUND

In general, carriers are utilized for transporting and storing batches of silicon wafers before during and after processing. The most common current wafer size is 300 mm, although some fabrication facilities are being planned and developed for 450 mm wafers. Typically, wafers are shipped between facilities in shipping containers known as front opening shipping boxes (FOSBs). In such shipping containers, the wafers are loaded into the container horizontally and are seated on shelves. The door is installed which causes the wafers to be raised off of the shelves and be suspended between forward and rearward wafer restraints. The container is then rotated 90 degrees such that the front door is facing upward and the wafers are vertical, spaced between the shelves. The FOSB with wafers is then boxed and shipped to a facility for the processing of the wafers. At the processing facility the wafers may be transferred into another process transport container known as a front opening unified pod (FOUP). The FOUP has a front latching door and receives wafers horizontally to seat on the shelves. Typically the shelves have structure for minimizing contact with the wafers. The wafers are removed from the FOUP for the processing that converts them into integrated circuit chips. Such processing involves multiple steps where the wafers are processed at various processing stations, and between processing steps the wafers are stored and transported within the facility, in the FOUP or other process transport container. The FOUP is typically transported with the wafers by way of overhead conveyors that grasp onto robotic flanges attached to top walls of such containers.

Due to the delicate nature of wafers and their susceptibility to damage by breakage or by contamination by particles or chemicals, it is vital that they be properly protected throughout their transport and processing life in the shipping boxes including FOSBs, process transport containers, including FOUPs. Although there are commonalities between shipping containers such as FOSBs and process transport containers such as FOUPs, they also are inherently different. With regard to shipping between facilities, the FOSB must provide enhanced protection from shock and vibration events within the shipping environment. Thus, great attention is devoted to adequately supporting the peripheries of the wafers and positioning the wafers between, and not contacting, shelves during shipments.

During such processing of semiconductor wafers, the presence of or generation of particulates presents very significant contamination problems. Contamination is accepted as the single largest cause of yield loss in the semi-conductor industry. As the size of integrated circuitry has continued to be reduced, the size of particles which can contaminate an integrated circuit has also become smaller making contamination control all the more. Contaminants in the form of particles may be generated by abrasion such as the rubbing or scraping of the carrier with the wafers, with the carrier covers or enclosures, with storage racks, with other carriers or with processing equipment. Additionally, particulates such as airborne microcontamination can be introduced into the containers through the openings or joints in the covers and enclosures. Additionally, certain gaseous contaminants may create haze on wafers which is also a problem. Thus, a critical function of wafer containers in the processing facility, such as FOUPs, is to protect the wafers therein from such contaminants. Such processing transport containers are typically equipped with gas purging capabilities for maintaining a very clean interior and minimizing any haze growth potential. Fluid conduits to facilitate the introduction and exhaustion of gases such as nitrogen or other purified gasses have been conventionally designed into the bottom walls of the container portions, as opposed to the doors, for example. Substrate containers have additionally been outfitted with various elastomeric grommets in the fluid conduits. These grommets include a bore of sufficient length to contain one or more various operational components inserted therein and positioned between the interior volume of the substrate container and the exterior.

SUMMARY

Various disclosed embodiments are directed to a front opening wafer shipper having an enclosure portion with an open side or bottom and a door to sealingly close the open side or open bottom. In one or more embodiments, the wafer shipper includes a plurality of wafer support shelves within the enclosure portion and wafer cushions positioned on the inside of the front door. In one or more embodiments, upon closing of the door, the wafer cushions raise the wafers to a shipping position spaced from the support shelves. The door couples with the enclosure portion to form a continuous enclosure that isolates the wafers from the ambient atmosphere. The container has an opening for providing a fluid passageway from the within the interior of the enclosure portion to an exterior region. The opening includes a receiving structure that defines the fluid passageway with a cylindrical wall having an inwardly facing surface. In one or more embodiments, a sealing member is situated within the receiving structure in a fluid-tight engagement. An outer surface of the sealing member establishes a generally fluid-tight seal against an inner surface of the inwardly facing wall surface receiving structure thereby closing the fluid passageway.

In operation, according to one or more embodiments, the sealing member maintains a seal against the receiving structure to prevent undesired chemicals or particulates from entering into the interior of the wafer shipper. Thus, any flow of fluid between the interior and exterior of the wafer shipper is limited based upon the insertion or removal of the sealing member.

In manufacturing, the use of uniform sizing of openings in various wafer shippers and uniform sizing of the sealing member permits modularization. Thus, for a product line of various wafer shippers having one or more access structures, the wafer shipper can initially be provided with sealing members, permitting for a fully sealed microenvironment within the container, but additionally allowing for configuration of the wafer shipper for various processing requirements by removal of the sealing members and replacement with other operational components. For example, the sealing members could be replaced by purge valves or grommets as illustrated in U.S. Pat. No. 8,727,125, or by other suitable component for providing purge ports, sensors, or other components in the wafer shipper.

The above summary is not intended to describe each illustrated embodiment or every implementation of the present disclosure.

BRIEF DESCRIPTION OF THE SEVERAL VIEWS OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the embodiments of the disclosure are amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Figure 1:
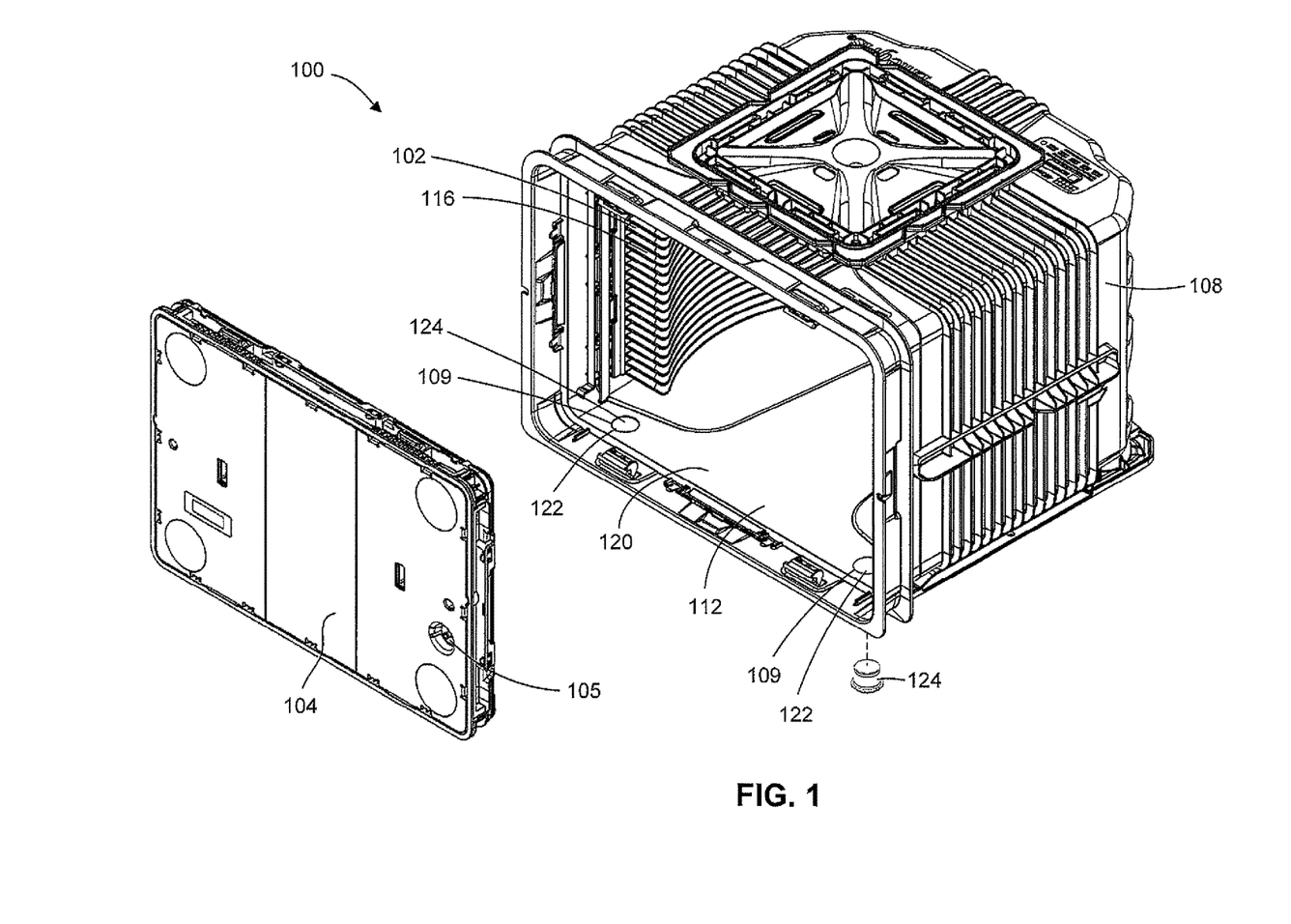
FIG. 1 is a partially exploded perspective view of an embodiment of a wafer shipper according to one or more embodiments of the disclosure.

FIG. 1 depicts an example wafer shipper 100 such as, for example, a front opening shipping box (FOSB). In various embodiments, wafer shipper 100 includes an enclosure portion 108, a door 104 and wafer shelves 102 positioned within the enclosure portion 108. Door 104 is adapted to sealable couple with the enclosure portion 108 to define a microenvironment within an interior 112 of the enclosure portion 108 that is sealed from ambient atmosphere. As shown in FIG. 1, wafer shelves 102 comprises a plurality of elements 116 that can hold and position a plurality of wafers or wafers within the enclosure portion 108. Generally, elements 116 hold and position the wafers such that contact between adjacent wafers is minimized. As such, elements 116 can reduce potential damage to wafers supported by the wafer shelves 102 during processing and transportation.

The enclosure portion 108 additionally includes one or more openings 122 in the bottom wall 120 of the enclosure portion. In various embodiments, the openings are defined by module receiving structures 109. Described further, such as in FIGS. 4 and 8, the module receiving structures 109 each include a cylindrical wall that extends downwardly from the bottom wall 120 and defines a fluid passageway into the interior 112 of the enclosure portion 108. In one or more embodiments, the opening(s) 122 provide locations for placement of various operational components and modules, such as purge valves/grommets as discussed above. In the depicted embodiment, sealing members 124 are located in each of the module receiving structures 109, sealing the fluid passageway of each of the respective module receiving structures 109. In various embodiments, the openings 122 and corresponding receiving structures 109 are positioned in the bottom wall 120 such that they enable the shipper 100 to interface with a standard load port interface.

In one or more embodiments, the door 104 includes a breather port 105. The breather port 105 can be outfitted with a filter or other component to allow airflow between the interior and exterior of the enclosure portion 108. Accordingly, the breather port 105 can be used to balance pressure in the enclosure portion 108 and assist in removal of the door 104. In certain embodiments, the breather port 105 could be outfitted with a sealing member or plug 124, when, for example the openings 122 and receiving structures 109 are outfitted with purge ports or other components that allow for pressure balance.

In the depicted embodiment in FIG. 1, the wafer shipper 100 is a FOSB designed for containing 450 mm wafers. In certain embodiments, the wafer shipper 100 is designed for containing wafers of other sizes. For example, in some embodiments, the wafer shipper 100 can be for containing 300 mm or larger wafers. While a FOSB is depicted in FIG. 1, in various embodiments, the wafer shipper 100 can be another type of front opening wafer container, such as a FOUP.

The structure of a wafer shipper is described in, for example, U.S. Pat. No. 6,428,729 to Bhatt et al., entitled "Composite Wafer Carrier," which is hereby incorporated by reference herein, except for express definitions and patent claims contained therein. Additionally, wafer containers having front openings with doors that latch onto the front openings, are described in U.S. Pat. Nos. 6,354,601, 5,788,082, 6,010,008, all owned by the owner of the instant application and all hereby incorporated by reference herein, except for express definitions and patent claims contained therein.

Figure 2:
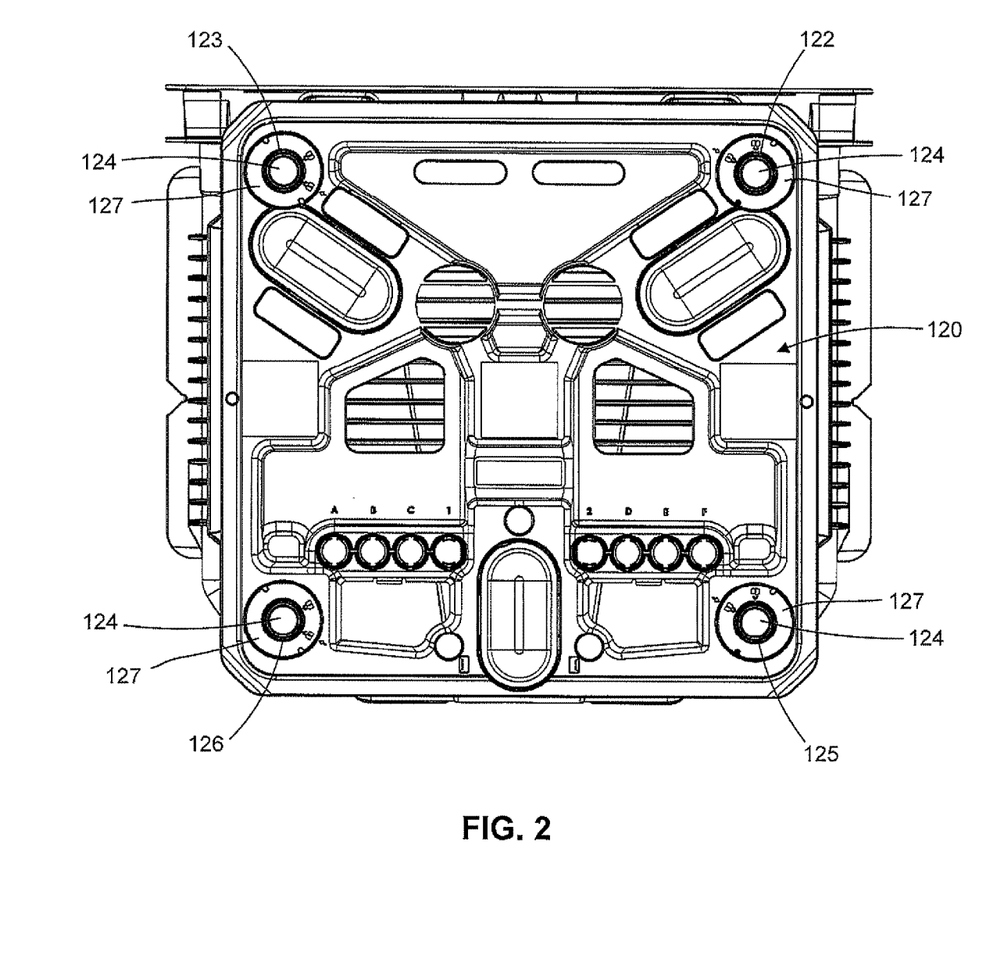
FIG. 2 is a bottom plan view of an example wafer shipper section including one or more sealing members, according to one or more embodiments of the disclosure.

FIG. 2 shows a bottom portion 120 of the example wafer shipper 100 shown in FIG. 1. In the embodiment depicted in FIG. 2, bottom portion 120 is a kinematic coupling plate attached to a bottom wall of the enclosure portion. In certain embodiments, the bottom portion 120 could be a non-removable, non-openable wall section, front door, bottom door, or other section of a wafer shipper.

Bottom portion 120 is illustrated including openings 122, 123, 125, 126 with sealing members 124 situated in openings 122, 123, 125, 126. Openings 122, 123, 125, and 126 each define a module receiving structure in the wafer shipper section 120 and in the corresponding wafer shipper that defines a fluid passageway for fluid to enter/exit the wafer shipper. Although FIG. 2 illustrates an embodiment where section 120 comprises four openings 122, 123, 125, 126, embodiments having fewer than or greater than four access structures located in section 120 are contemplated and are within the scope of the present disclosure. In some embodiments, the openings 122, 123, 125 and 126 are located such that they align with docking features on a standard load port interface.

Depicted in FIG. 2, sealing members 124 are received in each of the openings 122, 123, 125, 126, effectively sealing the openings to prevent the flow of fluid into or out of the interior of the wafer shipper. Described further, in various embodiments, the module receiving structures 109 defined by each of the openings 122, 123, 125, 126 define the fluid passageway. In certain embodiments the bodies of the sealing members 124 each have a cross-sectional shape that corresponds with the interior features of openings 122, 123, 125, 126 and are sized for an interference fit such that when received by the module receiving structure, the sealing members create an air-tight seal against an interior surface of the module receiving structure to substantially block the fluid passageway of each of the openings 122, 123, 125, 126. One of ordinary skill in the art will recognize that the cross-sectional shape and size of openings 122, 123, 125, 126, can be guided by operating pressures of a particular wafer shipper, and the various size and design for the openings and status openings in the wafer shipper.

In addition, in one or more embodiments, the openings 122, 123, 125, and 126 each include a connector lock 127. Depicted further in FIGS. 6A and 7, The connector lock 127 can be inserted into each of the openings 122, 123, 125, 126 to operably couple with the module receiving structures to secure a component in place that has been inserted into the openings 122, 123, 125, 126. For example, depicted in FIG. 2, the connector locks 127 are each securing the sealing members 124 in place in the openings 122, 123, 125, and 126. Furthermore, the connector locks 127 allow for quick access to the sealing members 124 for replacement, or reconfiguring of the wafer shipper. For example, while each of the openings 122, 123, 125, 126, are depicted with a sealing member 124, in various embodiments, one or more of the openings 122, 123, 125, 126 are configurable as inlet or outlet ports for introducing or removing purge gas in the wafer shipper. For example, in some embodiments, depending upon the requirements of the semiconductor process, a user could interchange the sealing members 124 with various operational components, for extra clean dry air (XCDA®) gas or nitrogen gas purge, or operational components such as those mentioned above and illustrated in U.S. Pat. No. 8,727,125.

Figure 3A:
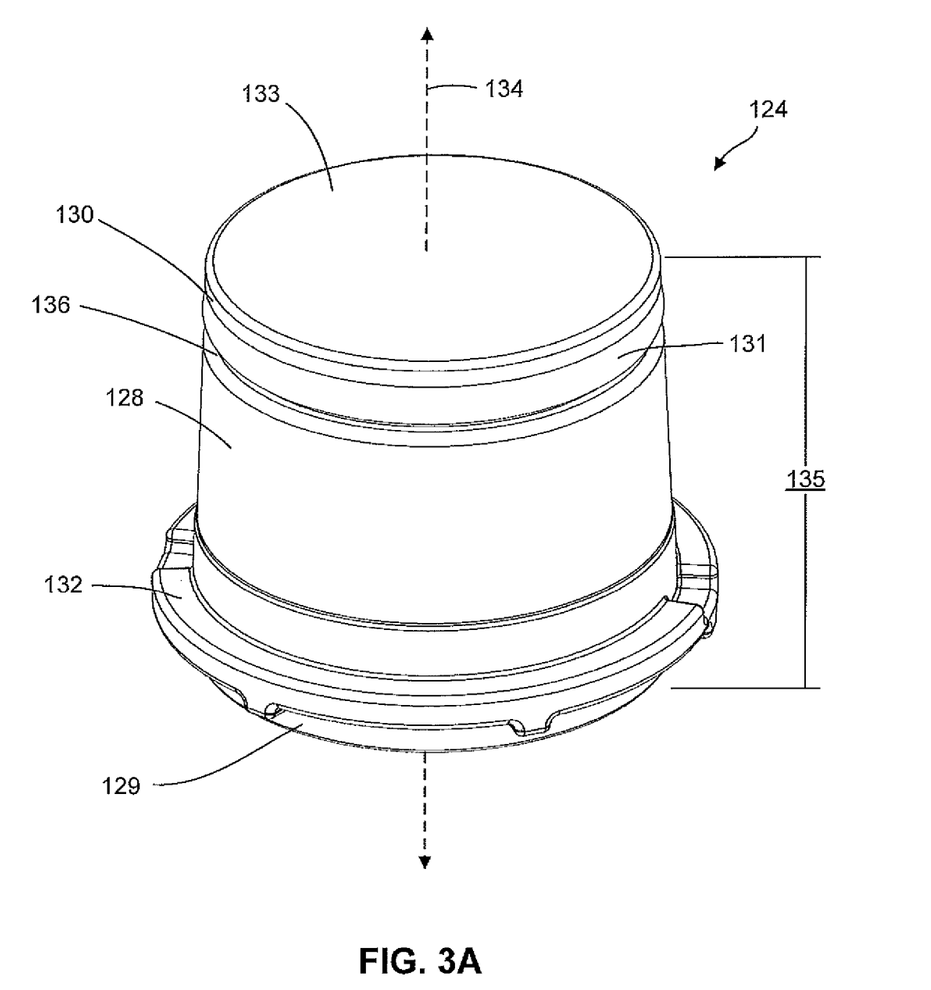
FIG. 3A is a perspective view of a sealing member, according to one or more embodiments of the disclosure.
Figure 3B:
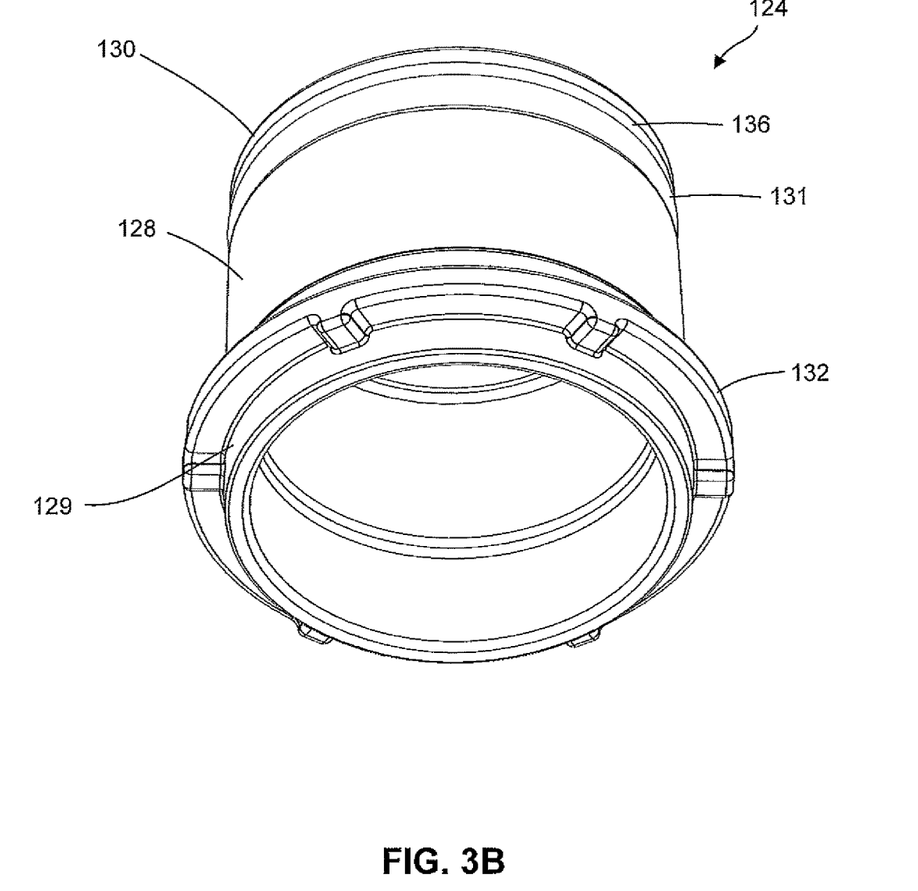
FIG. 3B depicts a bottom perspective view of a sealing member, according to one or more embodiments of the disclosure.

FIGS. 3A-3B show an exemplary sealing member 124. Sealing member 124, according to one or more embodiments, has a generally cylindrical body 128. Further, as depicted in FIGS. 3A-3B, the cylindrical body 128 is tapered, having a diameter that narrows from a relatively wider lower portion 129 of the cylindrical body 128 to relatively narrower upper portion 130. In various embodiments however, the sealing member 124 is constructed to have any suitable shape such that the sealing member 124 generally conforms to the size and shape of the various openings in a wafer shipper.

In some embodiments, body 128 includes sealing features in the form of a circumferential groove 136 situated along the exterior of the upper portion 130 of the cylindrical body 128 with a ring-shaped O-ring 131 situated within the circumferential groove 136. Sealing member 124 also includes a support flange 132 situated along the exterior of the lower portion 129 of the cylindrical body. Described further below, support flange 132 interacts with the module receiving structure situated in the openings of the wafer shipper to support the sealing member in position when inserted into the opening. The sealing member 124 additionally includes a planar top surface 133 arranged to be normal to a central axis 134. The top surface 133 is substantially solid, and acts as a plug member, sealing off the upper region of the opening when the sealing member 124 is inserted into a wafer shipper.

The sealing member 124 can be sized and dimensioned such that, when received in the module receiving structure, the sealing member forms an air-tight seal between the wall of the module receiving structure and the outer surface of the sealing member, effectively sealing the opening. In one or more embodiments, the sealing member 124 has an axial height 135 from about 0.3 cm to about 2.5 cm. In certain embodiments, the sealing member 124 can have an axial height 135 from about 1 cm to about 2 cm. Additionally, embodiments of sealing members of the present disclosure can have a diameter from about 0.6 cm to about 3.8 cm, while in other embodiments the sealing members can have a diameter from about 2 cm to about 30 cm. One of ordinary skill in the art will recognize that additional ranges of axial height 135 and diameter of the sealing members are contemplated and are within the scope of the present disclosure.

The cylindrical body 128, support flange 132, O-ring 131, and other components of the sealing members 124 of the present disclosure can be composed of any material suitable for use in semi-conductor processing applications including polymers and elastomers. In some embodiments, body 128 can be formed from rubber, or other elastomer or polymer having desired sealing characteristics. In some embodiments, at least the cylindrical body and flanges can be composed of a fluoroelastomer. Examples of fluoroelastomers are sold under the trademark Viton® by the Chemours Company FC, LLC. Additionally, in some embodiments, the elastomeric sealing member can have a fluoropolymer, or other inert polymer, coated onto to the surface of the sealing member to isolate the elastomeric substance from the interior of the wafer shipper. Generally, the polymer or fluoropolymer coating should have some flexibility such that the sealing characteristics of the elastomeric sealing member body are maintained.

FIGS. 4-7 depict various stages of assembly of the sealing member 124 and wafer shipper, according to one or more embodiments of the disclosure.

Figure 4:
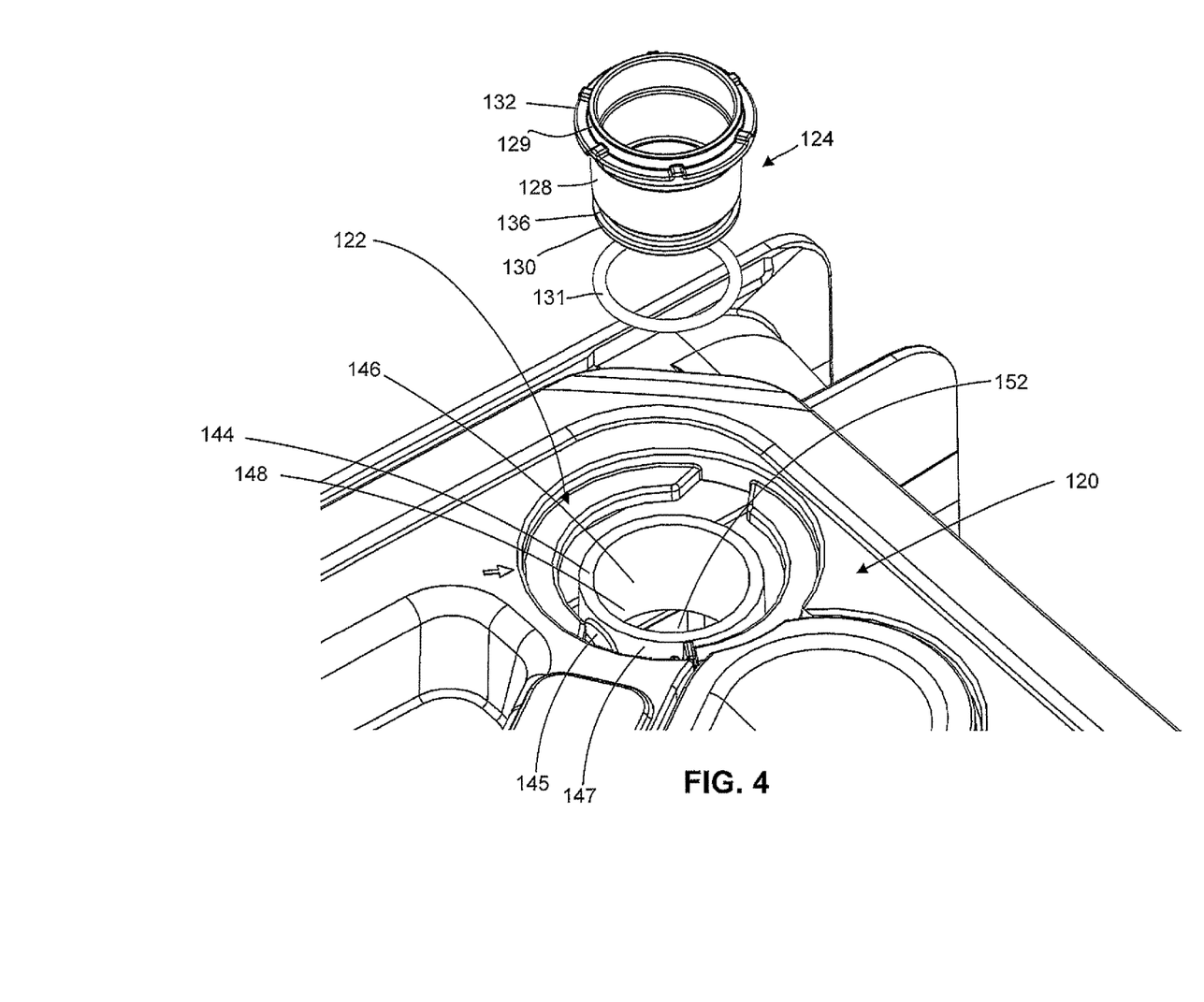
FIG. 4 depicts an exploded view of a sealing member and an example wafer shipper section, according to one or more embodiments of the disclosure.

In FIG. 4, a bottom perspective view of an opening 122 of a bottom wall 120 and sealing member 124 is depicted. As described above, the opening 122 defines a module receiving structure 144. In one or more embodiments, the module receiving structure includes a cylindrical body 146 that extends from the wafer shipper to define a fluid passageway 148 into an interior region 152 of the wafer shipper. In one or more embodiments, the cylindrical body 146 includes a protrusion 145 or nub positioned on an exterior surface 147. The sealing member 124 is oriented over and axially aligned with the fluid passageway 148, with the upper portion 130 directed toward the opening 122, for insertion into the module receiving structure 144.

Figure 5:
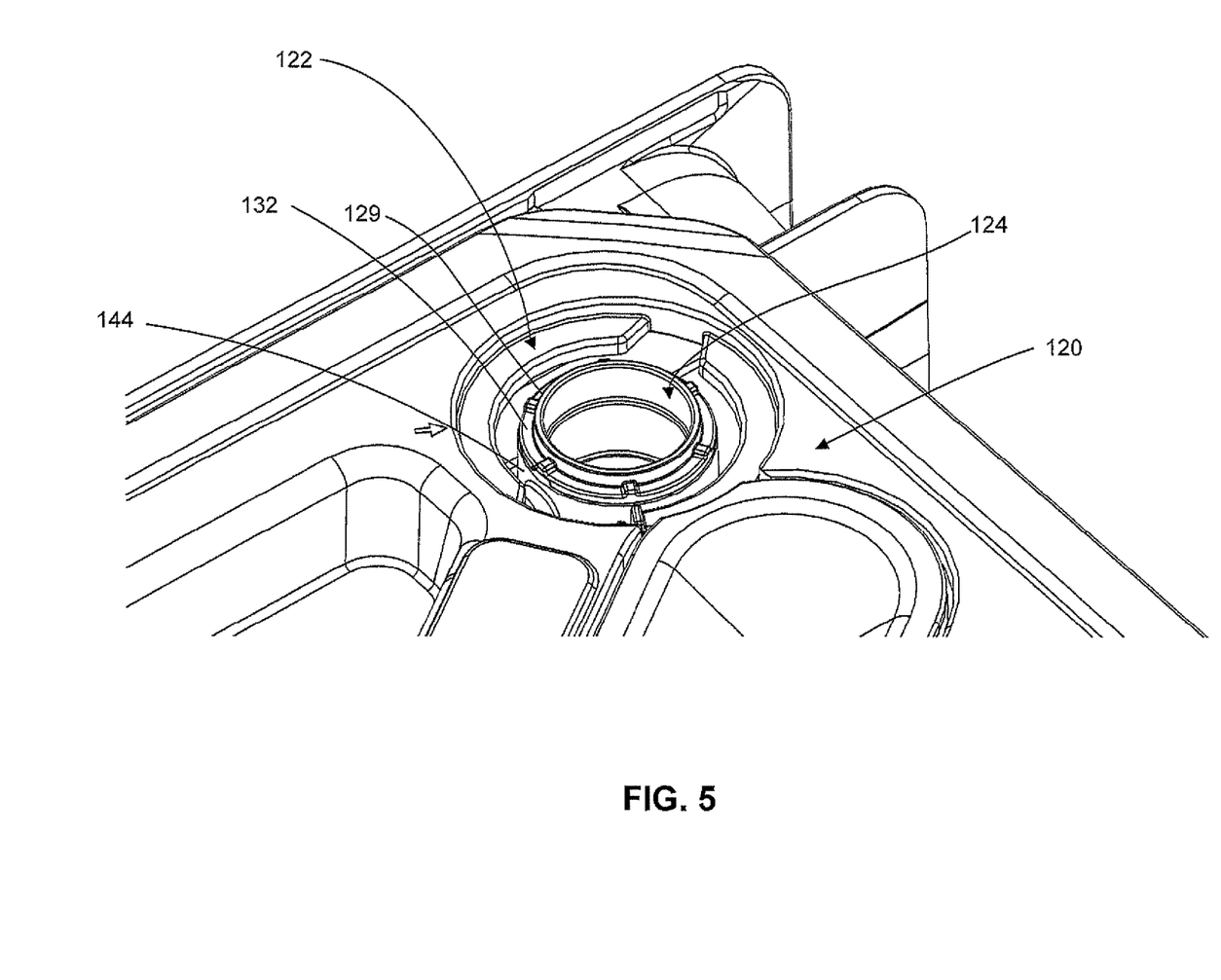
FIG. 5 depicts a sealing member inserted into a module receiving structure of an example wafer shipper section, according to one or more embodiments of the disclosure.

In FIG. 5, the sealing member 124 has been inserted into the module receiving structure 144. In various embodiments, when sealing member 124 is fully inserted into the module receiving structure, support flange 132 catches against the module receiving structure 144, indicating that the sealing member 124 has been fully and properly inserted into the fluid passageway 148.

Figure 6A:
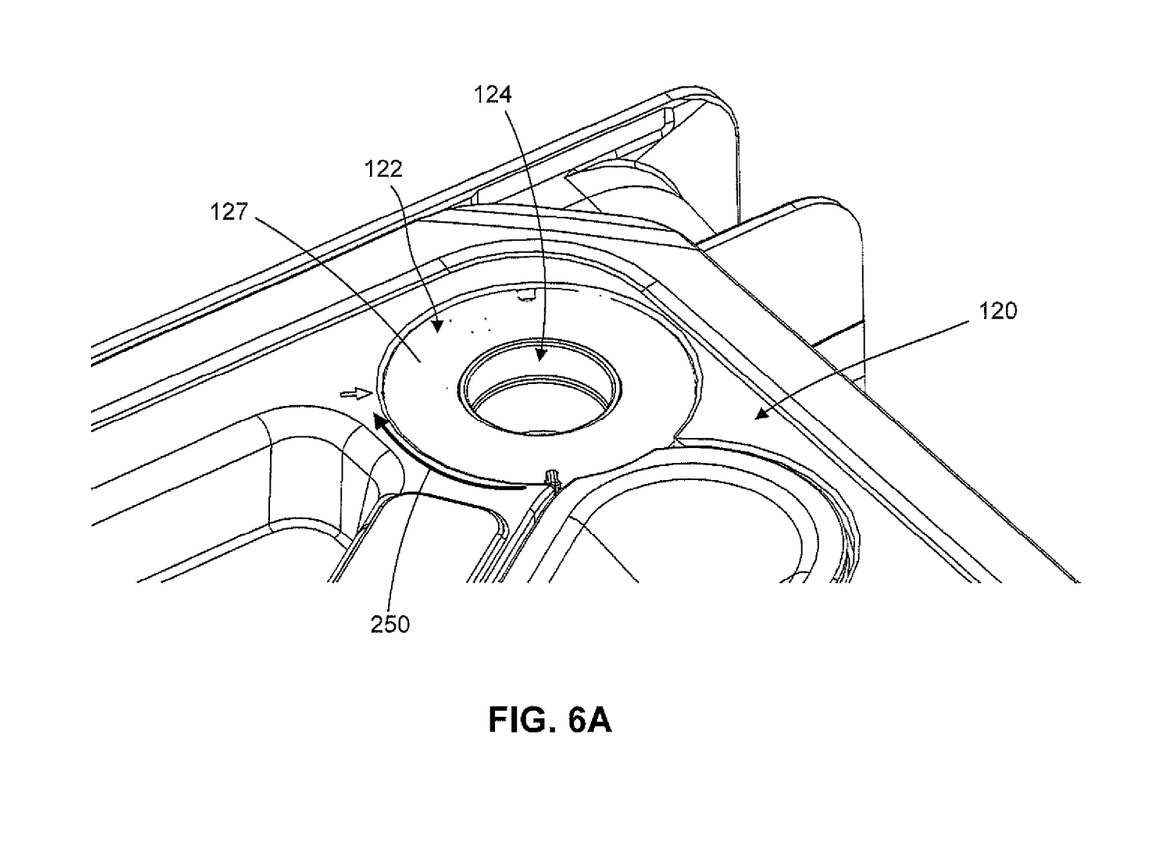
FIG. 6A depicts a sealing member inserted into an opening of an example wafer shipper section that includes a connector lock, according to one or more embodiments of the disclosure.
Figure 6B:
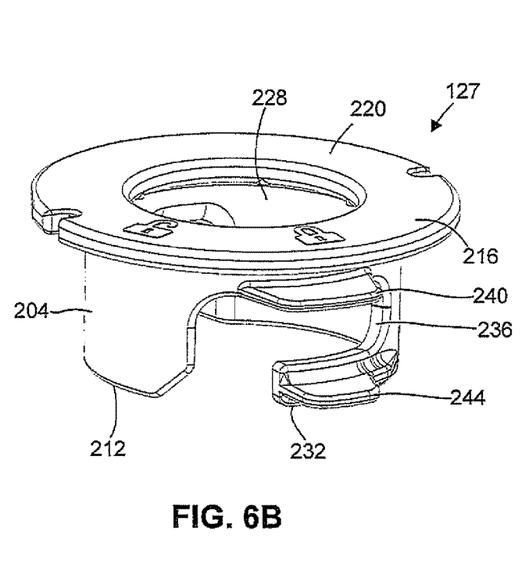
FIGS. 6B and 6C depict perspective views of a connector lock, according to one or more embodiments of the disclosure.
Figure 6C:
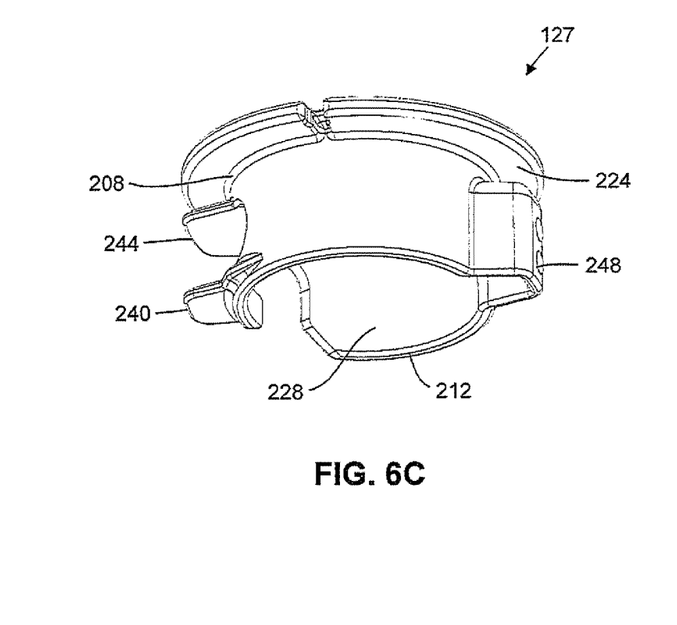
Figure 7:
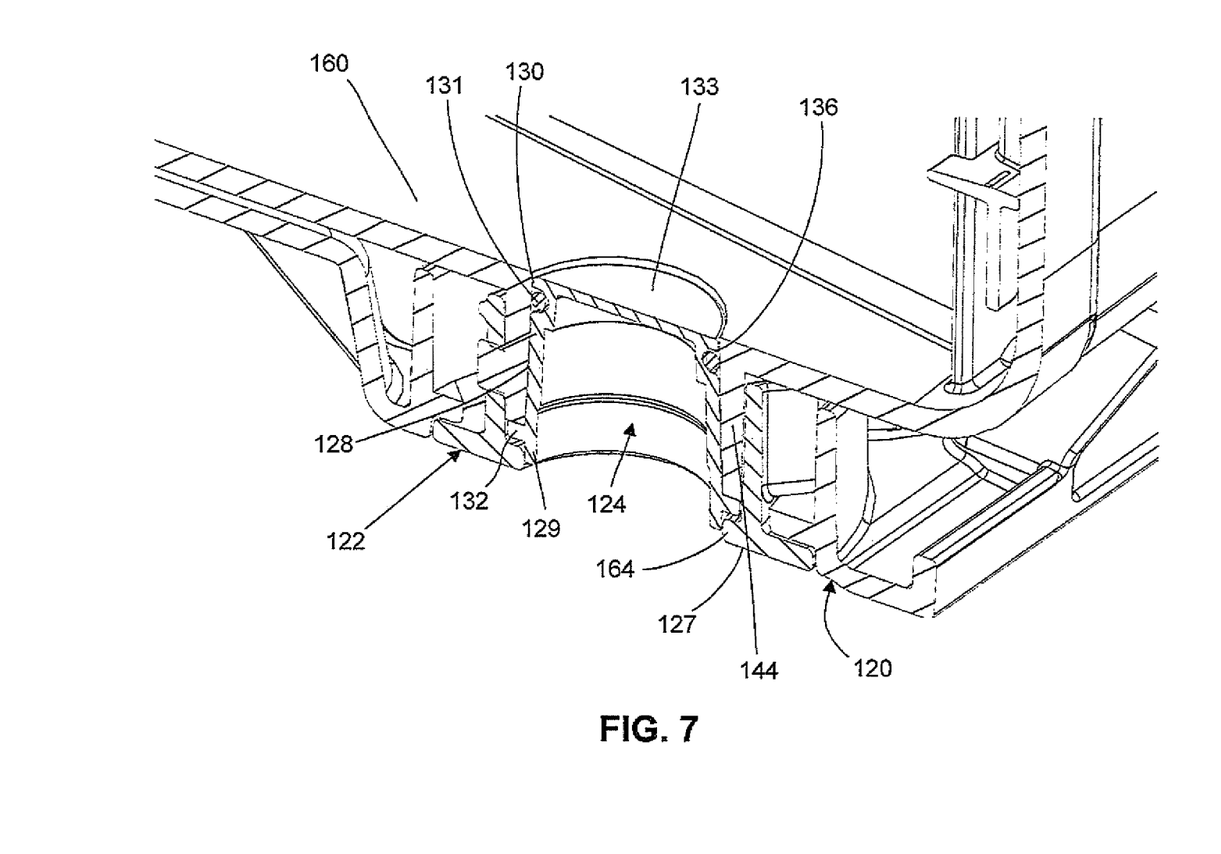
FIG. 7 depicts a cross sectional view of an example wafer shipper that includes a sealing member inserted into an opening, according to one or more embodiments of the disclosure.

In FIGS. 6A and 7, the connector lock 127 has been inserted into the opening 122, subsequent to the insertion of the sealing member 124, and locked in place. In FIGS. 6B and 6C, perspective views of the connector lock 127 are depicted. A function of the connector lock 127 is to secure the bottom wall 120 to the container while not utilizing threads and using a partial rotation. For example, in some embodiments the connector lock secures to the bottom wall 120 with a rotation of less than 180 degrees, and in certain embodiments, by utilizing a rotation of about 90 degrees.

In one or more embodiments the connector lock 127 includes a substantially cylindrical body 204 with a flanged end 208 and a flangeless end 212, with a flange 216 of the flanged end 208 having a superior or outward-facing surface 220 and an inferior or inward-facing surface 224. The cylindrical body 204 that defines an interior through port 228. The connector lock 127 can also include an arcuate arm 232 formed proximate the flangeless end 212 of the cylindrical body 204. The arcuate arm 232 defines a tangential slot 236 that is accessible from the flangeless end 212. In one embodiment, a superior or outward tab 240 extends radially from the cylindrical body 204 and an inferior or inward tab 244 extends radially from the arcuate arm 232, the tabs being located on opposing sides of the tangential slot 236. The connector lock 127 can further include a boss 248 on the cylindrical body 204. In the depicted embodiment, the boss 192 is substantially diametrically opposed to the tangential slot 186. Depicted in FIG. 6A, the connector lock 127 is inserted into the opening 122 and rotated a direction 250 such that the protrusion 145 of the module receiving structure 144 cooperates with the tangential slot 236 of the connector lock 127 to provide a bayonet-style connection.

Additional Description of insertion and securing of the connector lock 127 into the opening 122 and operative coupling with the module receiving structure 144 is depicted in U.S. Patent Publication No.: 2015/0041353 to Adams et al., owned by the owner of the instant application and hereby incorporated by reference herein, except for express definitions and patent claims contained therein.

Seen in FIG. 7, the sealing member 124 is inserted upwardly into the module receiving structure 144 and, once fully inserted, support flange 132 catches against module receiving structure 144 to halt insertion of the module 124. In various embodiments, when fully inserted, the top surface 133 is positioned substantially flush with an interior surface 160 of the wafer shipper. Additionally, when inserted, the generally tapered cylindrical body 128 conforms to the tapered shape of the module receiving structure 144 and O-ring 131, situated in groove 136, forms an air-tight seal against the interior of the module receiving structure 144. Thus, the sealing member 124 prevents the passage of fluid, or particulates from entering or exiting from the wafer shipper through the fluid passageway of opening 122.

Connector lock 127 is inserted and secured into opening 122. As a result, sealing member 124 is situated between the interior of the wafer shipper and the connector lock 127. The connector lock includes an inwardly extending flange portion 164 at the lower portion 129 of the sealing member 124. The flange portion 164 is positioned adjacent to the support flange 144 to retain the sealing member in place as the support flange is directly sandwiched between the flange portion of the connector lock 127 and the module receiving structure 144.

Figure 8:
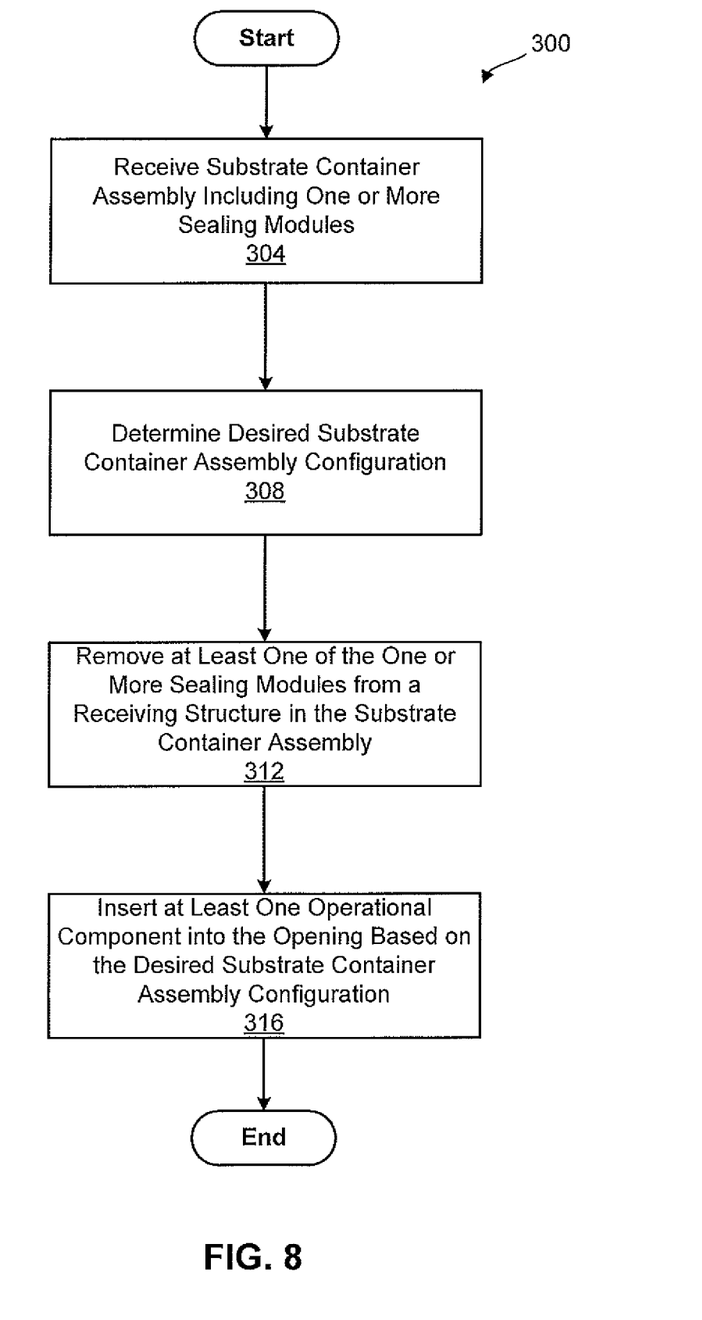
FIG. 8 depicts a flowchart diagram of a method of upgrading a wafer shipper with one or more operational components, according to one or more embodiments of the disclosure.

Referring to FIG. 8, a flowchart diagram of a method 300 of upgrading a wafer shipper is depicted, according to one or more embodiments. The method 300 includes, in operation 304, receiving a wafer shipper including one or more sealing members disposed in the module receiving structures of the container assembly. The wafer shipper, in various embodiments, is the same or substantially similar to wafer shipper 100 depicted in FIG. 1.

In operation 308, the method 300 includes determining a desired configuration for the wafer shipper. As discussed above, in various embodiments the wafer shipper utilizes uniformly sized openings/module receiving structures in the enclosure portion. Thus, for a product line of various wafer shippers having one or more module receiving structures, the wafer shipper can initially be provided with sealing members in each of the module receiving structures and permitting for a fully sealed microenvironment within the container, but allowing for configuration of the wafer shipper with various operational components.

In one or more embodiments, the wafer shipper may be configured with one or more operational components based on a desired configuration that is determined from the various processing requirements for wafers/wafers that will be/are inserted into the container. For example, based on the expected processing, shipping, or other requirements, the wafer shipper can be outfitted with purge valves, sensors, or other operational components that are necessary for such requirements.

Accordingly, in operation 312, at least one of the sealing members is removed from the module receiving structure of the wafer shipper and, in operation 316, at least one operation component, selected based on the desired wafer shipper configuration, is inserted into the module receiving structure, thereby upgrading the wafer shipper. Removal of the sealing members and insertion of the operational component is discussed above, and illustrated in U.S. Patent Publication No.: 2015/0041353.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A purge configurable wafer shipper comprising:
an enclosure portion with an open side or bottom,
a door for sealing the open side or bottom, one of the door and the enclosure portion including:
an opening formed in the enclosure portion to provide a fluid passageway from an interior of the wafer shipper to an exterior region, wherein the opening includes a module receiving structure that defines the fluid passageway; and
a sealing member for insertion into the module receiving structure, the sealing member having a body portion with a shape corresponding to an interior surface of the module receiving structure, the body portion including:

a support flange positioned proximate a lower portion of the body portion, the support flange extending outwardly from an exterior surface of the body portion;
a circumferential groove in the exterior surface of the body portion and positioned proximate an upper portion of the body portion;
a substantially planar top surface, the top surface arranged substantially normal to a central axis through the body portion; and
an O-ring positioned at least partially within the circumferential groove; wherein, when fully inserted into the module receiving structure, the support flange abuts the module receiving structure thereby halting insertion and positioning the top surface substantially flush with an interior of the wafer shipper, and the O-ring forming an air-tight seal against the interior of the module receiving structure to seal the opening, preventing passage of fluid through the fluid passageway.

2. The wafer shipper of claim 1, wherein the module receiving structure is a cylindrical structure and the body portion is a cylindrical body portion having a cylindrical exterior surface configured to engage with a cylindrical interior surface of the module receiving structure.

3. The wafer shipper of claim 2 wherein the cylindrical body portion has a tapered shape that extends from the lower portion to a tapered upper portion.

4. The wafer shipper of claim 1, further comprising a connector lock configured to operably engage with the module receiving structure for locking the sealing member in the opening, wherein, when the sealing member is fully inserted into the module receiving structure, the connector lock is operably engaged with the module receiving structure thereby sandwiching the support flange between the module receiving structure and the connector lock to secure the sealing member in the module receiving structure.

5. The wafer shipper of claim 1, wherein the wafer shipper is a 300 mm wafer shipper.

6. The wafer shipper of claim 1, wherein the wafer shipper is a 450 mm wafer shipper.

7. The wafer shipper of claim 1, wherein the container portion further includes a plurality of openings, and wherein at least one of the openings of the plurality of openings includes the sealing member, and another opening of the plurality of openings includes an operational component for purging of the wafer shipper.

8. The wafer shipper of claim 1, wherein the opening is one of a plurality of openings formed in the enclosure portion, the plurality of openings positioned to correspond with a standard load port interface.

9. The wafer shipper of claim 1, wherein the opening is formed on the bottom of the enclosure portion and wherein the wafer shipper further comprises a kinematic coupling plate attached to the bottom.

10. The wafer shipper of claim 1, wherein the wafer shipper is a front opening shipping box.

11. A method of configuring a wafer shipper for purge capability, the wafer shipper including an enclosure portion with an open side or bottom and a door to seal the open side or bottom, one of the door and the enclosure portion including an opening with a module receiving structure that defines a fluid passageway from the interior of the wafer shipper to an exterior region, the wafer shipper including a sealing member inserted into the module receiving structure, the sealing member having a body portion including a support flange positioned proximate a lower portion of the sealing member, the support flange extending outwardly from an exterior surface of the body portion, the body portion including a circumferential groove in the exterior surface of the body portion positioned proximate an upper portion of the sealing member, the body portion including a substantially planar top surface, the top surface arranged substantially normal to a central axis through the body portion, and the body portion including an O-ring positioned at least partially within the circumferential groove, the method including:
removing the sealing member from the opening; and
inserting, in response to removing the sealing member, an operational component, for purging of the wafer shipper, into the opening.

12. The method of claim 11, wherein the module receiving structure is a cylindrical structure and the body portion is a cylindrical body portion having a cylindrical exterior surface configured to engage with a cylindrical interior surface of the module receiving structure.

13. The method of claim 12 wherein the cylindrical body portion has a tapered shape that extends from the lower portion to a tapered upper portion.

14. The method of claim 11, wherein the wafer shipper further includes a connector lock operably engaged with the module receiving structure and locking the sealing member in the opening.

15. The method of claim 11, wherein the wafer shipper is a 300 mm wafer shipper.

16. The method of claim 11, wherein the wafer shipper is a 450 mm wafer shipper.

17. The method of claim 11, wherein the opening is one of a plurality of openings formed in the enclosure portion, the plurality of openings positioned to correspond with a standard load port interface.

18. The method of claim 11, wherein the opening is formed on the bottom of the enclosure portion and wherein the wafer shipper further comprises a kinematic coupling plate attached to the bottom.

19. The method of claim 11, wherein the wafer shipper is a front opening shipping box.

* * * * *